United States Patent [19]

Baudry

[11] Patent Number: 4,684,543
[45] Date of Patent: Aug. 4, 1987

[54] STARTING MIXTURE FOR AN INSULATING COMPOSITION COMPRISING A LEAD GLASS, SILK-SCREENING INK COMPRISING SUCH A MIXTURE, AND THE USE OF SAID INK FOR THE PROTECTION OF HYBRID MICROCIRCUITS ON CERAMIC SUBSTRATES

[75] Inventor: Hugues Baudry, Varennes-Jarcy, France

[73] Assignee: U.S. Philips Corporation, New York, N.Y.

[21] Appl. No.: 745,734

[22] Filed: Jun. 17, 1985

[30] Foreign Application Priority Data

Jun. 22, 1984 [FR] France .................. 84 09809

[51] Int. Cl.⁴ .............................. B05D 5/12
[52] U.S. Cl. .......................... 427/96; 106/19; 106/20; 106/26; 106/290; 106/296; 106/297; 427/388.1
[58] Field of Search ............. 106/19, 20, 26, 308 C, 106/296, 297, 290; 427/96, 388.1

[56] References Cited

U.S. PATENT DOCUMENTS

| | | | |
|---|---|---|---|
| 4,108,786 | 8/1978 | Takayama et al. | 252/62.1 |
| 4,152,282 | 5/1979 | Baudry et al. | 106/20 |
| 4,369,220 | 1/1983 | Prabhu et al. | 427/96 |
| 4,388,347 | 6/1983 | Shum et al. | 427/96 |
| 4,412,377 | 11/1983 | Nagashima et al. | 427/96 |
| 4,415,624 | 11/1983 | Prabhu et al. | 427/96 |
| 4,420,338 | 12/1983 | Ortega | 106/20 |
| 4,431,451 | 2/1984 | Mabie et al. | 501/141 |
| 4,547,625 | 10/1985 | Tosaki et al. | 427/96 |
| 4,604,298 | 8/1986 | Shevtchuk et al. | 427/96 |

FOREIGN PATENT DOCUMENTS 1489031 10/1977 United Kingdom .

*Primary Examiner*—Paul Lieberman
*Assistant Examiner*—Willie J. Thompson
*Attorney, Agent, or Firm*—Paul R. Miller

[57] ABSTRACT

The invention relates to starting mixtures for an insulating composition comprising (a) a from about 70 to 80% by volume of vitreous phase comprising $Al_2O_3$, $SiO_2$, $B_2O_3$, PbO, ZnO, CaO, and CuO and (b) from about 30 to 20% by volume of at least one oxide of lead having an oxidation degree of at least two, in powder form. The starting mixtures are useful in silk-screening inks for hybrid microcircuits.

12 Claims, 2 Drawing Figures

STARTING MIXTURE FOR AN INSULATING COMPOSITION COMPRISING A LEAD GLASS, SILK-SCREENING INK COMPRISING SUCH A MIXTURE, AND THE USE OF SAID INK FOR THE PROTECTION OF HYBRID MICROCIRCUITS ON CERAMIC SUBSTRATES

The invention relates to the formulation of a starting mixture for an insulating composition comprising on the one hand a vitreous phase formed by alumina ($Al_2O_3$), silica ($SiO_2$), boric oxide ($B_2O_3$) and including lead monoxide (PbO), and on the other hand one or several lead oxides in powder form having a degree of oxidation higher than or equal to two.

The invention also relates to a silk-screening ink formed from such a composition.

The invention finally relates to a method of manufacturing a hybrid microcircuit on a ceramic substrate, including the use of such ink as a protective layer called "encapsulation".

It is known to manufacture microcircuits in so-called hybrid technology on a ceramic substrate by means of silk-screening ink layers which are alternately conductive and insulating. A silk-screening conductive ink which is compatible with a ceramic substrate is known in particular from British Patent No. 1489031 and a silk-screening insulating ink which is compatible with the conductive ink is known from U.S. Pat. No. 4,152,282. Discrete elements such as resistors may moreover be obtained, for example, by mseans of a resistive ink such as is known from U.S. Pat. No. 4,420,338, all in the name of Applicants.

However, the circuits manufactured by means of such inks must keep their performances during their entire lifetime. The production of the silk-screening components, and more in particular of the resistors, against mechanical or chemical influences originating from their environment is hence necessary. The protection must on the one hand be compatible with the materials constituting the circuits and on the other handd must be in agreement with their method of manufacturing. The most evident solution to manufacture a protective layer on a hybrid circuit is to provide a silk-screening protective layer.

It is to be noted that such a protective layer hence necessitates a supplementary firing of the circuit on which it is realised. Although the conductors and insulators forming the circuit are comparatively insensitive to refiring, since their formulation is provided for the manufacture of multilayers, this is not the case for the resistors.

In fact, the latter, known, for example, from U.S. Pat. No. 4,420,338 cited hereinbefore, are constituted substantially by a mixture of metal hexaborides and a glass frit. The value of the resistors depends on the quantity of the intergranular material formed by reaction between the vitreous phase and the hexaborides. The quantity of material certainly depends considerably on the firing conditions, that is, the duration and the temperature. According to the refiring experiences which have been effected on such resistors it would appear obvious that the variations of the values of the resistors during a refiring are much less when the temperature of refiring is low.

In order to limit the influence of such a refiring on the sensitive circuit elements, for example resistors, as much as possible, the silk-screening ink chosen as a layer of encapsulation must in the first place have a firing temperature lower than 600° C. with the temperature value being determined as an upper limit during the experiments carried out.

On the other hand, for fulfilling the function of an encapsulation layer, the ink must have sealing properties and form a layer which is as compact as possible while being electrically insulating, which means an electric conductivity which is as low as possible.

Finally, the encapsulation layer must be compatible with the other conductive and insulating layers realised in accordance with the documents cited hereinbefore to constitute the hybrid microcircuits. The layers have the property that they can be fired under a non-oxidizing atmosphere so as to avoid the oxidation of copper conductors. In this condition, the desired encapsulation must also have the property that it can be fired under a non-oxidizing atmosphere. The composition destined to form the encapsulation must therefore contain itself an oxide capable, by decomposition during the firing, of providing oxygen which is indispensable for the combustion of the organic carrier in which the composition is dispersed thus avoiding the formation of carbon residues during the operation.

So the technical problem is the following: in order to protect hybrid circuits realised on a ceramic substrate and in particular resistors, it is suitable to provide a silk-screening ink for encapsulation which has the following characteristics:

a low firing temperature, very much below 600° C.;
a coefficient of expansion near that of the ceramic;
a high compactness;
an electric conductivity which is as weak as possible;
the possibility of firing under a neutral atmosphere.

A starting mixture obtained by dispersion in an organic carrier is silk-screening ink which has the following characteristics:

a firing temperature of 550° C.;
a weak conductivity allowing use as an electrically insulating layer;
the firing possibility under a neutral atmosphere is known from the prior art from EP-A2-68,565 in the name of Applicants.

The mixture comprises on the one hand a vitreous part constituted by molar ratios of the following oxides: alumina ($Al_2O_3$) 5 to 15%, silica ($SiO_2$) 25 to 45%, boric oxide ($B_2O_3$) 0 to 10%, and lead monoxide (PbO) 40 to 60%, and on the other hand ceramic phases such as lanthanum aluminate ($LaAlO_3$) in a proportion by volume of 1 to 10% and lead dioxide ($PbO_2$) in a proportion by volume of 15 to 1%, the vitreous phase therefore being present in a proportion by volume of approximately 85%.

However, the ink obtained starting from the starting mixture also presents properties which make it incompatible with the object in view to be obtained and in particular:

a coefficient of thermal expansion adapted to the substrates of enamelled sheet metal, so much higher for a substrate of alumina;
a vitrification (enamelling) which is insufficient due to the fact that it has been studied to realise an electrically insulating layer and not an encapsulation layer.

Therefore, in order to avoid these disadvantages and to solve the technical problem the present invention proposes a starting mixture such as described in the opening paragraph which is characterized in that the vitreous phase comprises in addition an oxide of zinc (ZnO), of calcium anhydride (CaO) and of the oxide of copper (CuO) and in that the vitreous phase represents 70 to 80% of the mixture while the oxides of lead having an oxidation degree higher than or equal to two represent 30 to 20% by volume of the mixture.

According to a particular embodiment of the invention, the mixture is characterized in that the oxide of the chosen oxidation degree higher than or equal to two is lead dioxide ($PbO_2$).

According to a preferred embodiment the mixture is characterized in that the vitreous phase is constituted by molar ratios of the following oxides: alumina ($Al_2O_3$) 5%, silica ($SiO_2$) 40%, boric oxide ($B_2O_3$) 20%, lead monoxide (PbO) 22%, calcium oxide (CaO) 3%, zinc oxide (ZnO) 8% and, copper oxide (CuO) 2%.

Finally, according to the preferred embodiment, the mixture is characterized in that the vitreous phase represents 75% by volume and the lead dioxide represents 25% by volume of the mineral phases.

In these conditions the ink obtained by dispersing the composition in an organic carrier makes it possible to solve the technical problem due to the fact that it presents the following properties:
- a firing temperature of 550° C., which is remarkable;
- a coefficient of expansion adapted to that of the ceramic between 0° C. and the firing temperature, thus avoiding shrinkage and deformation during cooling;
- a very good sealing;
- a very low conductivity;
- the possibility of firing under nitrogen;
- green colouring favouring visual control after firing and adjustment by laser of the resistors.

The invention will now be described in greater detail, by way of example, with reference to the accompanying drawing, in which.

Figure 1:
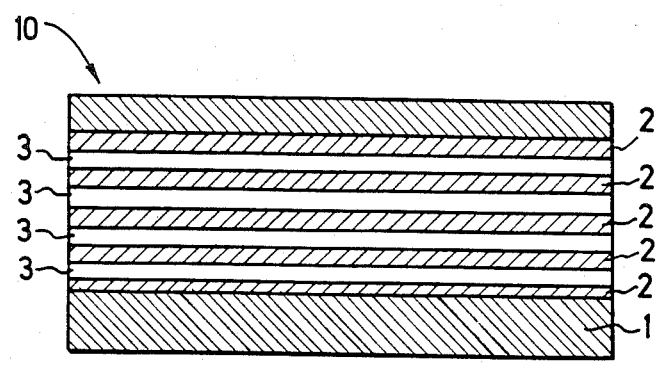
FIG. 1 is a sectional view of a microcircuit including an encapsulation layer according to the invention.

According to the present invention a starting mixture for a silk-screening ink destined to fulfill the encapsulation function is therefore formed of a lead-glass to which is added (are added) one (or several) lead oxides in powder form having an oxidation degree equal to or higher than two.

In a preferred embodiment, lead dioxide ($PbO_2$) is used in association with a frit glass realised by means of the following oxides of which the ratios are given in Table I.

TABLE I

| Vitreous phase: molar ratios | |
|---|---|
| PbO | 22% |
| $SiO_2$ | 40% |
| $B_2O_3$ | 20% |
| $Al_2O_3$ | 5% |
| CaO | 3% |
| ZnO | 8% |
| CuO | 2% |
| Starting mixture: proportions by volume | |
| Glass previously pulverised: | 75% |
| $PbO_2$ powder: | 25% |
| Composition of the organic carrier: by weight | |
| Ethyl cellulose | 5% |
| Terpineol | |
| Acetate of butyl carbitol | 95% |
| Dibutyl phthalate | |

As is known from the prior art mentioned hereinbefore the use of lead oxide (PbO) in the formation of the vitreous phase makes it possible to obtain a reduction of the melting point of the glass hence of the firing temperature of the ink. According to the document, with ranges from 40 to 60 mol% of PbO in the vitreous phase, the vitreous phase representing thus 85% by volume of the mixture, which includes in addition 5 to 15% of lead oxide participating in achieving the same object, a lowering of the firing point of the ink up to 550° C. is obtained.

The temperature is indeed sufficient to solve the technical problem. However, the very high lead oxide ratios which have made it possible to reduce the temperature have on the other hand led at the same time to the appearance of a strong coefficient of expansion of the layers realised by means of the mixture.

So it is just endeavoured to reduce the coefficient of expansion. Actually, the ink manufactured according to the teaching of the document was adapted to a substrate of enamelled plate while the ink according to the present invention must be adapted to a ceramic substrate having a lower coefficient of expansion.

According to the present invention these difficulties are solved by the addition in the vitreous phase of three modifiers, namely, calcium oxide (CaO), zinc oxide (ZnO), and copper oxide (CuO). The oxides not only permit not to augment the lead oxide ratios but also to diminish them with respect to what was recommended by the document, at the same time obtaining the very low firing temperature and the desired coefficient of expansion. It will be noted that the copper oxide provides the supplementary advantage of colouring the enamel green thus allowing a better absorption of the laser beam energy used for cutting the ceramic substrates at the end of manufacturing the circuits. Finally it is to be noted that the layers manufactured by means of the ink prepared from the mixture show a high compactness and a perfect tightness.

However, an extra difficulty still remains to be solved due to the fact that when a lead glass is used to constitute an ink the latter does not stand heating under neutral atmosphere, for example nitrogen, because it decomposes rapidly with decomposition resulting from the reduction of the lead oxide (PbO) at temperatures of the order of 450° C. The cited document recommends the addition of oxides to a degree of oxidation higher than two, for example, of lead dioxide ($PbO_2$) in powder form, which, while releasing the oxygen at the firing instant, avoids the reduction of the lead monoxide (PbO) contained in the vitreous phase and to burn the organic carrier without leaving carbon residues.

However, the lead oxides having a degree of oxidation higher than or equal to two which are incorporated in the mixture in powder form are dissolved by the vitreous phase in the form of lead monoxide (PbO) during firing, risking destruction of the equilibrium between the value of the firing temperature and the value of the coefficient of expansion.

To this effect, by proposing for the constituents of the mixture the ratios having values recorded in Table I, the present invention makes it possible to solve efficaciously all the problems at a time.

A method of manufacturing an ink according to the invention is given by way of example.

The vitreous composition having ratios given in Table I is crushed for 64 hours in a ball mill and intimately mixed with lead dioxide ($PbO_2$) in a ratio of 75% by volume for the vitreous phase and 25% by volume for the dioxide. After filtering and drying, the powder mixture obtained is dispersed in the organic carrier having a preferred composition given in Table I.

The ink thus manufactured is silk-screened as the last coating layer of hybrid circuits on ceramic substrates or an encapsulation layer of resistances manufactured by means of hexaboric inks, or as an encapsulation layer of other elements also on a ceramic substrate.

The encapsulation layer is then fired in a migratory furnace at 550° C. under nitrogen (10 mn constant with cycles of 1 hour).

With respect to resistors, for example, the use of encapsulation leads to derivatives of approximately:

0.03% for 1 k$\Omega\square^{-1}$ which may go up to

3% for 100 k$\Omega\square^{-1}$ which is considered acceptable by all means.

FIG. 1 shows an example of the use of the ink as an encapsulation.

On an alumina substrate 1 is manufactured a circuit comprising, for example, a succession of conductive layers 2 alternated by insulating layers 3 manufactured by means of masks through the silk screening screens according to a previously determined pattern of electric interconnections. The number of conductive layers may be higher than 5. The materials used to manufacture the layers are in agreement with the cited patents of conductive and insulating inks. The last deposited layer 10 is the encapsulation layer according to the invention.

Figure 2:
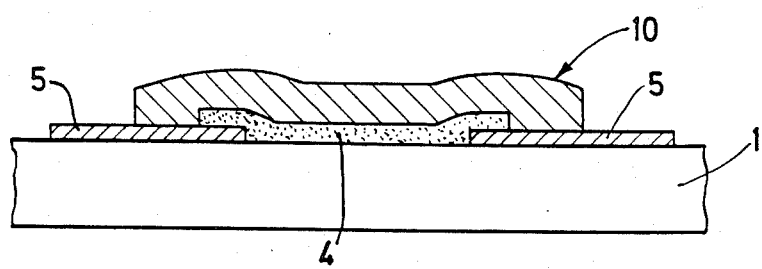
FIG. 2 is a sectional view of a resistor including an encapsulation layer according to the invention.

FIG. 2 shows a second example of the use of the ink as an encapsulation.

On a substrate 1 of alumina, a layer of a conductive silk-screening ink according to the invention is deposited according to a suitable pattern to form electric contacts 5. The layer is fired at a high temperature, in general of the order of 850° to 900° C. Then, a layer 4 of hexaboric ink is deposited by silk-screening according to a pattern previously defined to form the resistor with the layer bearing on the electric contacts 5. The layer 4 is heated at a temperature of the order of 800° C. Finally a layer 10 of ink for encapsulation according to the present invention is manufactured on the surface of the assembly, with the exception of the electric terminals of the conductors, in a manner to provide a pad for making contacts.

After the firing of the last layer 10 in the conditions described hereinabove, the resistor may be adjusted by means of a laser beam through the encapsulation layer, and the substrate of alumina may then be cut also by laser on the periphery of the resistor so as to constitute a discrete element.

It will be obvious that numerous variations are possible, for example, in the use of the starting mixture, or in the equivalent substituents of this composition, without therefor departing from the scope of the present invention.

What is claimed is:

1. A starting mixture for an insulating composition comprising on the one hand a vitreous phase formed from alumina ($Al_2O_3$), silica ($SiO_2$), boric oxide ($B_2O_3$) and including a lead monoxide (PbO), and comprising on the other hand one or several lead oxides having a degree of oxidation higher than or equal to two in powderform, characterized in that the vitreous phase includes in addition zinc oxide (ZnO), calcium oxide (CaO) and copper oxide (CuO) and in that said vitreous phase represents 70 to 80% of the mixture said mixture containing a second phase consisting of $PbO_2$ and constituting 30% to 20% by volume of the mixture.

2. A mixture as claimed in claim 1, characterized in that the vitreous phase is formed by molar ratios of the following oxides: alumina ($Al_2O_3$) 5%, silica ($SiO_2$) 40%, boric oxide ($B_2O_3$) 20%, lead monoxide (PbO) 22%, calcium anhydride (CaO) 3%, zinc oxide (ZnO) 8%, copper oxide (CuO) 2%.

3. A mixture as claimed in claim 2, characterized in that the vitreous phase represents 75% by volume and lead dioxide 25% by volume.

4. A silk-screening ink comprising a mixture as claimed in any one of the claims 1 to 3, is incorporated in an ethyl cellulose solution in terpineol carrier.

5. An ink as claimed in claim 4, characterized in that it is used as a protection layer for hybrid microcircuits manufactured on a substrate of alumina deposited by silk-screening on the surface of said circuits and fired at a temperature of 550° C. constant for at least 5 minutes.

6. A starting mixture for an insulating composition comprising (a) from about 70 to 80% by volume, based upon the total volume of the mixture, of a vitreous phase comprising $Al_2O_3$, $SiO_2$, $B_2O_3$, PbO, ZnO, CaO, and CuO and (b) from about 30 to 20% by volume, based upon the total volume of the mixture $PbO_2$ in powder form.

7. A starting mixture for an insulating composition consisting essentially of (a) from 70 to 80% volume, based upon the total volume of the starting mixture, of a mixture, in mol % of:

$Al_2O_3$: 5,
$SiO_2$: 40,
$B_2O_3$: 20,
PbO: 22,
CaO: 3,
ZnO: 8,
CuO: 2, and (b) from about 30 to 20% by volume, based upon the total volume of the starting mixture, of $PbO_2$.

8. A starting mixture of claim 6 or 7, wherein component (a) represents 75% by volume and component (b) represents 25% by volume.

9. A silk-screening ink for hybrid circuit fabrication comprising a starting mixture of claim 6 or 7 and an organic carrier.

10. A silk-screening ink of claim 9, wherein the organic carrier is an ethyl cellulose solution in terpineol.

11. A silk-screening ink of claim 9 which comprises an insulatingly effective amount of the starting mixture.

12. A method of forming a protective layer on a hybrid microcircuit having an alumina substrate which comprises depositing on the surface of said microcircuit a silk-screening ink of claim 9 and then heating said thus-treated microcircuit at 550° C. for at least five minutes.

* * * * *